(12) United States Patent
Zhang

(10) Patent No.: US 9,666,641 B2
(45) Date of Patent: May 30, 2017

(54) COMPACT THREE-DIMENSIONAL MEMORY

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 139 days.

(21) Appl. No.: 14/636,346

(22) Filed: Mar. 3, 2015

(65) Prior Publication Data

US 2015/0295011 A1 Oct. 15, 2015

Related U.S. Application Data

(60) Provisional application No. 61/979,501, filed on Apr. 14, 2014.

(51) Int. Cl.
| | | |
|---|---|---|
| *H01L 27/24* | (2006.01) | |
| *H01L 27/06* | (2006.01) | |
| *H01L 45/00* | (2006.01) | |
| *G11C 13/00* | (2006.01) | |

(52) U.S. Cl.
CPC ...... *H01L 27/2436* (2013.01); *G11C 13/0023* (2013.01); *H01L 27/0688* (2013.01); *H01L 27/2481* (2013.01); *H01L 45/04* (2013.01); *G11C 13/0004* (2013.01); *G11C 13/0007* (2013.01); *G11C 13/0011* (2013.01); *G11C 2213/71* (2013.01); *G11C 2213/72* (2013.01)

(58) Field of Classification Search
CPC . H01L 27/2436; H01L 27/2481; H01L 45/04; H01L 27/0688; H01L 27/1154; H01L 27/11578; H01L 27/11597; H01L 27/281; G11C 13/0002; G11C 13/0004; G11C 13/0007; G11C 13/0011; G11C 13/0023; G11C 2213/71; G11C 2213/72
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |

(Continued)

*Primary Examiner* — Michael Zarroli

(57) ABSTRACT

The present invention discloses a compact three-dimensional memory (3D-$M_C$). By forming simple switching devices (e.g., pass transistors) on the address-select lines, contact vias can be shared by the address-select lines in the same memory level, or from different memory levels. This leads to sparser and fewer contact vias.

20 Claims, 13 Drawing Sheets

(56) References Cited

U.S. PATENT DOCUMENTS

| | | | |
|---|---|---|---|
| 5,838,530 A | 11/1998 | Zhang | |
| 5,841,150 A | 11/1998 | Gonzalez et al. | |
| 5,843,824 A | 12/1998 | Chou et al. | |
| 5,847,442 A | 12/1998 | Mills, Jr. et al. | |
| 5,854,111 A | 12/1998 | Wen | |
| 5,904,526 A | 5/1999 | Wen et al. | |
| 5,907,778 A | 5/1999 | Chou et al. | |
| 5,943,255 A | 8/1999 | Kutter et al. | |
| 6,015,738 A | 1/2000 | Levy et al. | |
| 6,021,079 A | 2/2000 | Worley | |
| 6,034,882 A | 3/2000 | Johnson et al. | |
| 6,049,481 A | 4/2000 | Yamasaki | |
| 6,055,180 A | 4/2000 | Gudesen et al. | |
| 6,185,122 B1 | 2/2001 | Johnson et al. | |
| 6,221,723 B1 | 4/2001 | Kunitou | |
| 6,236,587 B1 | 5/2001 | Gudesen et al. | |
| 6,380,597 B1 | 4/2002 | Gudesen et al. | |
| 6,385,074 B1 | 5/2002 | Johnson et al. | |
| 6,515,888 B2 | 2/2003 | Johnson et al. | |
| 6,587,387 B1 | 7/2003 | Fan et al. | |
| 6,773,937 B1 | 8/2004 | Ho et al. | |
| 7,054,219 B1* | 5/2006 | Petti | G11C 5/02 365/230.06 |
| 7,892,865 B2 | 2/2011 | Yano et al. | |
| 7,952,904 B2 | 5/2011 | Zhang | |
| 7,969,011 B2* | 6/2011 | Sekar | H01L 45/00 257/750 |
| 8,000,134 B2 | 8/2011 | Cornwell et al. | |
| 8,120,068 B2* | 2/2012 | Scheuerlein | G11C 13/0004 257/211 |
| 8,284,589 B2* | 10/2012 | Scheuerlein | B82Y 10/00 365/148 |
| 8,559,209 B2* | 10/2013 | Siau | G11C 8/08 365/130 |
| 8,659,028 B2* | 2/2014 | Scheuerlein | G11C 7/18 257/390 |
| 8,897,050 B2* | 11/2014 | Siau | G11C 5/02 365/100 |
| 8,988,930 B2* | 3/2015 | Chevallier | G11C 11/21 365/148 |
| 9,129,830 B2* | 9/2015 | Baek | H01L 27/0688 |
| 9,159,913 B2* | 10/2015 | Rinerson | G06F 17/5045 |

\* cited by examiner

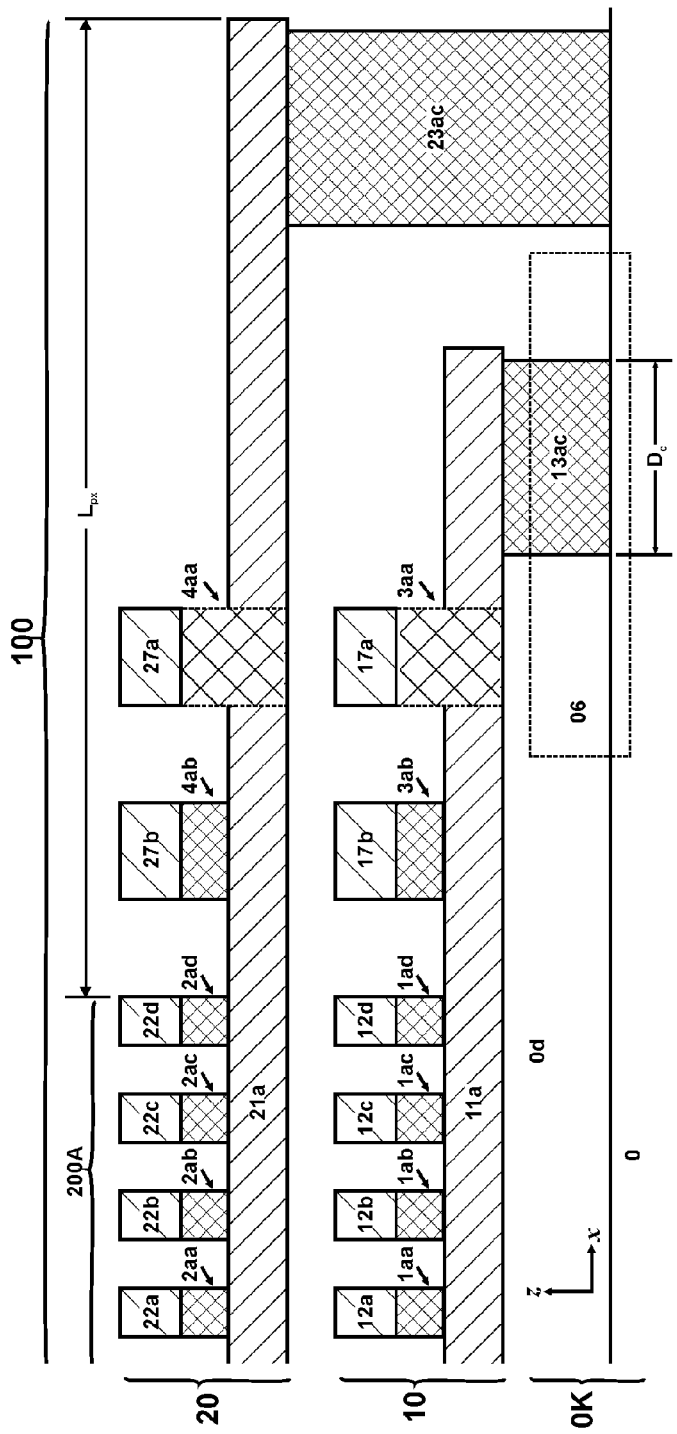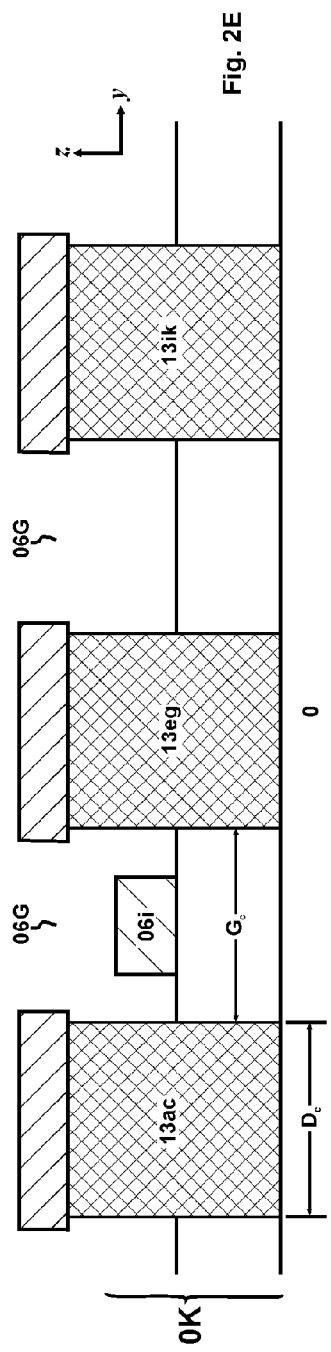

COMPACT THREE-DIMENSIONAL MEMORY

CROSS-REFERENCE TO RELATED APPLICATIONS

This claims benefit of a provisional application, "Compact Three-Dimensional Memory", Application Ser. No. 61/979,501, filed Apr. 14, 2014.

BACKGROUND

1. Technical Field of the Invention

The present invention relates to the field of integrated circuit, and more particularly to three-dimensional memory (3D-M).

2. Prior Arts

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further comprise at least one of a memristor, a resistive random-access memory (RRAM or ReRAM), a phase-change memory, a programmable metallization cell (PMC), a conductive-bridging random-access memory (CBRAM) or other memory devices.

U.S. Pat. No. 5,835,396 issued to Zhang on Nov. 3, 1998 discloses a 3D-M, more particularly a 3D-ROM (FIG. 1A). It comprises a substrate 0 and a substrate circuit 0K located thereon. An insulating dielectric 0d covers the substrate circuit 0K and is planarized. A first memory level 10 is stacked above the insulating dielectric 0d, with a second memory level 20 stacked above the first memory level 10. The substrate circuit 0K comprises first and second decoders 14, 24 for the first and second memory levels 10, 20, respectively. Each of the memory levels (e.g. 10, 20) comprises a plurality of upper address-select lines (i.e. y-lines, e.g. 12a-12d, 22a-22d), lower address-select lines (i.e. x-lines, e.g. 11a, 21a) and memory devices (e.g. 1aa-1ad, 2aa-2ad) at the intersections between the upper and lower address lines.

The structure shown in FIG. 1A is part of a memory block 100 of the 3D-M. A memory block 100 is a basic building block of a 3D-M die. Within the topmost memory level 20 of the memory block 100, all address-select lines 21a, 22a-22d are continuous and terminate at or near the edge of the memory block 100. The memory devices (e.g. 2aa-2ad) in each memory level (e.g. 20) of the memory block 100 form a memory array (e.g. 200A). A 3D-M die comprises a multiple of memory blocks (e.g., 100).

The first and second memory levels 10, 20 are coupled to the substrate circuit 0K through contact vias 13a, 23a, respectively. The contact vias are generally interleaved (FIG. 1B). To be more specific, the x-lines (e.g. 11a, 11c) have their contact vias (e.g. 13a, 13c) formed to their right end (+x direction), while their immediately neighboring x-lines (e.g. 11b, 11d) have their contact vias (not shown) formed to their left end (−x direction). Interleaving relaxes the contact-via pitch $p_c$ to twice the x-line pitch p, i.e. $p_c$=2p. Here, a pitch is the center-to-center distance between two adjacent contact vias (or, two adjacent lines). In most cases, the line pitch p is twice the line width f (i.e. p=2f). Apparently, the contact-via size $d_c$ and spacing $g_c$ are twice the x-line width f (i.e. $d_c$=2f, $g_c$=2f) (FIG. 1C). Even so, because the line width f can be made half of the minimum lithography resolution F (i.e. f=F/2), the contact-via size is still the minimum lithography resolution F (i.e. $d_c$=F, $g_c$=F). Because they need a high-resolution (F-node) mask, the contact vias incur a high manufacturing cost.

In the present invention, all contact vias associated with a single memory level are collectively referred to as a contact-via set (FIG. 1E). For example, all contact vias (e.g. 13a-13z) associated with the memory level 10 form a first contact-via set 13, and all contact vias (e.g. 23a-23z) associated with the memory level 20 form a second contact-via set 23. Because each memory level has its own contact-via set (FIG. 1A), a 3D-M with a large number of memory levels needs a large number of contact-via sets. This further increases the manufacturing cost.

Each memory device is generally a two-terminal device, which is located at the cross point between the upper and lower address lines. Accordingly, the memory array 100A is a cross-point array (FIG. 1D). The symbol for the memory device 1aa represents that each memory device 1aa comprises a programmable layer and a diode. The state of the programmable layer can be altered during or after manufacturing. Note that the programmable layer and the diode can be merged into a single layer, as disclosed in U.S. Pat. No. 8,071,972 issued to Lu et al.

Throughout the present invention, a diode is broadly interpreted as any two-terminal device whose resistance at the read voltage is substantially lower than when the applied voltage has a magnitude smaller than or polarity opposite to that of the read voltage. It is also referred to as quasi-conduction layer in Zhang (U.S. Pat. No. 5,835,396). In one exemplary embodiment, the diode is a semiconductor diode, e.g. p-i-n silicon diode, as disclosed in Crowley et al. "512 Mb PROM with 8 Layers of Antifuse/Diode Cells" (referring to 2003 International Solid-State Circuits Conference, FIG. 16.4.1). In another exemplary embodiment, the diode is a metal-oxide diode, e.g. titanium oxide, nickel oxide, as disclosed in Chevallier et al. "A 0.13 um 64 Mb Multi-Layered Conductive Metal-Oxide Memory" (referring to 2010 International Solid-State Circuits Conference, FIG. 14.3.1).

According to the above definition, a diode can be conductive in both polarities, as long as its resistance becomes substantially lower when the applied voltage increases to the read voltage. For example, although the metal oxide layer in Chevallier et al. has a nearly symmetric I-V characteristic, it is still considered as a diode because its I-V characteristic is logarithmic.

With a small contact-via spacing ($g_c$=20, these dense contact vias (e.g., 13a, 13c, 13e) form an impenetrable fence, whose gap 04g cannot be passed by any interconnect in the substrate circuit 0K (FIG. 1C). This severely limits the design flexibility of the substrate circuit 0K. Because the dense contact vias completely separate the first and second decoders 14 & 24, the second decoder 24 cannot share any components with the first decoder 14 and needs to be a full decoder (FIG. 1E). This requires the x-line 21a on the memory level 20 to extend an excessive distance $L_{px}$ to reach the contact vias 23a (FIG. 1A). Long $L_{px}$ lowers the array efficiency and reduces the memory density. More details will be disclosed in the following paragraphs.

The excessive distance $L_{px}$ extended by the x-line 21a is referred to as the x-peripheral length. It is defined as the length of the x-line 21a from the last memory device tad of the memory array 200A to the edge of the x-line 21a or the contact via 23a, whichever is longer (FIG. 1A). Because the topmost memory level 20 has the longest x-line and defines the footprint of the memory block 100, $L_{px}$ only needs to be defined for the topmost memory level 20. Likewise, a y-peripheral length $L_{py}$ can be defined. For a memory array 200A containing N*N memory devices, the useful length $L_m$ of the x-line 21a (i.e., the length used for the memory devices) is N*p, with its total length $L_t$=N*p+2$L_{px}$. Accordingly, the x-efficiency $E_x$, which is the percentage of the x-line 21a used for memory devices, can be expressed as $Ex=L_m/L_t=(1+2L_{px}/N/p)^{-1}$; and the array efficiency $E_A$, which is the percentage of the memory array 200A used for memory devices, is a product of $E_x$ and $E_y$ (y-efficiency), i.e. $E_A=E_x*E_y=(1+2L_{px}/N/P)^{-1}(1+2L_{py}/N/P)^{-1}$.

To accommodate a full decoder 24 between the contact vias 13a and 23a on the substrate 0, the x-line 21a of the memory level 20 has to be extended by at least a full width $W_D$ of the decoder 24, i.e., $L_{px}>W_D$ (FIGS. 1A & 1E). Likewise, the y-line 22a also needs to be extended by an excessive distance. Large peripheral lengths $L_{px}$ and $L_{py}$ increase the memory-array size, lower the array efficiency and reduces the memory density.

Besides the above adverse effects, dense contact vias cast a shadow on the future of three-dimensional integrated circuit (3D-IC). In the post Moore's Law era, 3D-IC is a natural extension of the conventional two-dimensional integrated circuit (2D-IC). 3D-M is considered as a most suitable candidate for the 3D-IC because its memory levels do not occupy any substrate and its substrate can be used to form circuit components such as a processor. One possible 3D-IC is a 3D-M-based system-on-a-chip (SoC). However, as dense contact vias partition the substrate into isolated regions, the layout of the substrate circuit become difficult if not impossible.

OBJECTS AND ADVANTAGES

It is a principle object of the present invention to provide a three-dimensional memory (3D-M) with a lower manufacturing cost.

It is a further object of the present invention to improve the design flexibility of the substrate circuit of a 3D-M.

It is a further object of the present invention to facilitate the realization of a three-dimensional integrated circuit (3D-IC).

It is a further object of the present invention to facilitate the realization of a 3D-M-based system-on-a-chip (SoC).

It is a further object of the present invention to provide a 3D-M with a simpler decoder design.

It is a further object of the present invention to provide a 3D-M with a better array efficiency.

It is a further object of the present invention to provide a 3D-M with a larger memory density.

In accordance with these and other objects of the present invention, a compact 3D-M is disclosed. Its memory levels comprise simple switching devices (e.g., pass transistors), whose formation requires minimum extra processing steps.

SUMMARY OF THE INVENTION

The present invention discloses a compact three-dimensional memory (3D-$M_C$). Simple switching devices are formed to function as a decoder stage for the memory array. When the decoder stage is an intra-level decoder stage, contact vias can be shared by address-select lines in the same memory level; when the decoder stage is an inter-level decoder stage, contact vias can be shared by address-select lines from different memory levels. Sharing leads to sparse contact vias (relative to prior arts), fewer contact-via sets (in an extreme case, all 8 memory levels share a single contact-via set) and therefore, a lower manufacturing cost. Furthermore, because sparse contact vias allow interconnects to pass through, decoders can be shared for different memory levels. This results in shorter peripheral lengths $L_{px}$, $L_{py}$, a higher array efficiency (as high as ~95%) and therefore, a higher memory density. More importantly, sparse contact vias facilitate the integration of the 3D-M and the substrate-circuit components (e.g., a processor). This has profound effects on the realization of three-dimensional integrated circuit (3D-IC). For example, 3D-M-based system-on-a-chip (SoC) can be realized.

Each switching device is formed at the intersection of a control line and an address-select line (e.g. x-line). It is positioned between memory devices and the contact via. The switching device is generally a three-terminal device, e.g. a pass transistor. Examples include MOSFET (metal-oxide-semiconductor FET) and JFET (junction FET). It has a conduction mode and a blocking mode. In the conduction mode, the switching device is turned on and configured to allow current flow in the address-selection line. In the blocking mode, the switching device is turned off and configured to block current flow in the address-selection line.

The switching device (e.g., pass transistor) has a simple structure (i.e., simple switching device) so that its manufacturing introduces minimum extra processing steps. The key to a simple switching device is to form a semi-conductive segment in the address-selection line underneath the control line. In one preferred embodiment, the address-selection line comprises a heavily doped semiconductor material, while the address-selection line-segment within the switch device is counter-doped in such a way that it becomes semi-conductive. In another preferred embodiment, the address-selection line comprises a lower semi-conductive layer and an upper highly-conductive layer. Within the switching device, the upper highly-conductive layer of the address-selection line is removed and only the lower semi-conductive layer remains. In yet another preferred embodiment, the address-selection line comprises a metallic material while the portion of the address-selection line within the switching device is removed and filled with a semi-conductive material.

BRIEF DESCRIPTION OF THE DRAWINGS

FIG. 2C is a side view of the first preferred 3D-$M_C$; FIG. 2E is a cross-sectional view of FIG. 2D along the cut-line BB';

Figure 1A:
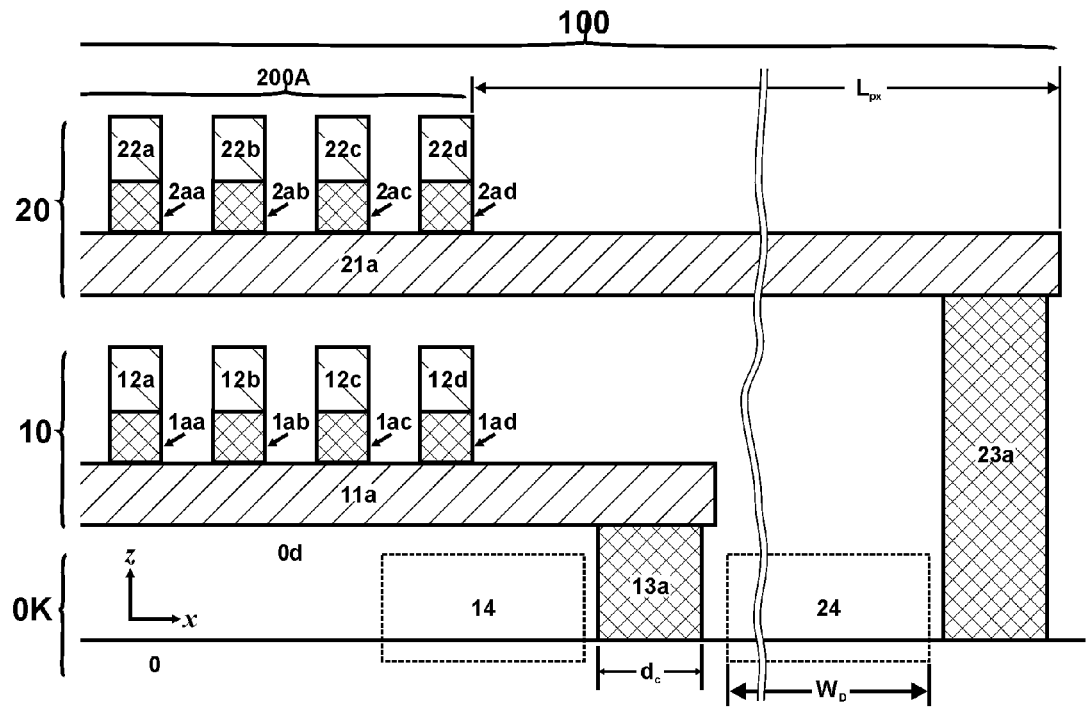
FIG. 1A is a cross-sectional view of a prior-art three-dimensional memory (3D-M)
Figure 1B:
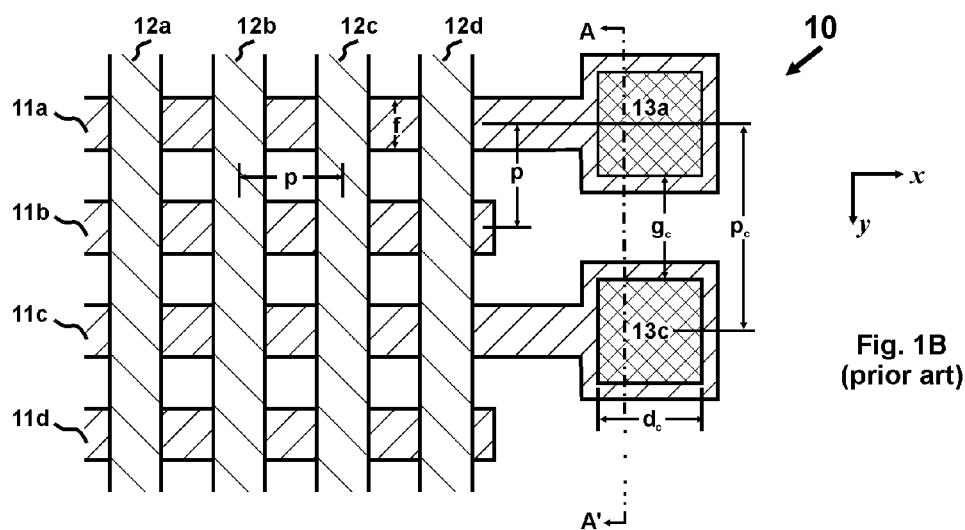
FIG. 1B is a top view of the memory level 10.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The directions of x (e.g., in the x-line) and y (e.g., in the y-line) are relative. They only mean that these address-selection lines (i.e., x-line, y-line) have different orientation.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2A:
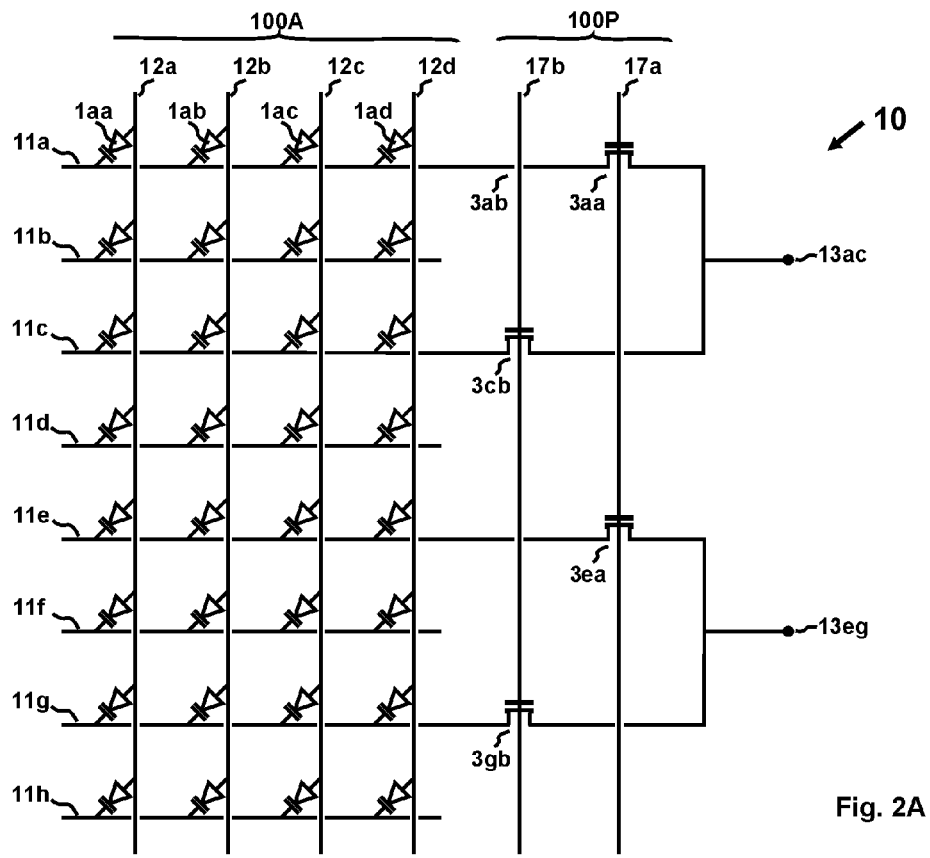
FIG. 2A is a circuit schematic for the memory level 10 of a first preferred compact three-dimensional memory (3D-$M_C$), including an intra-level decoder stage.
Figure 2B:
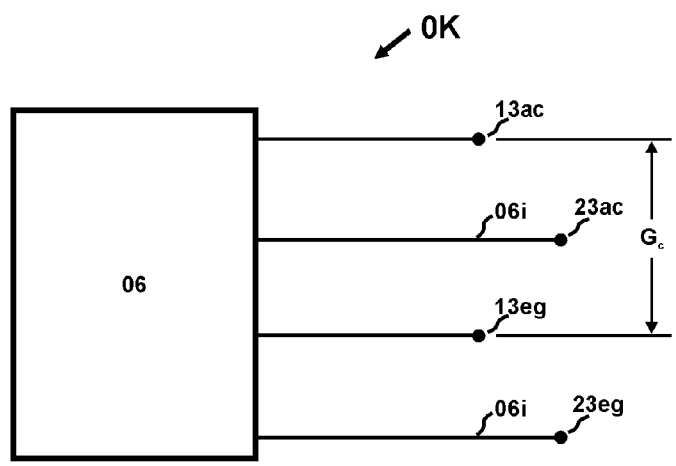
FIG. 2B is a block diagram of the substrate circuit 0K including an inter-level decoder stage 06a for memory levels 10, 20.
Figure 2D:
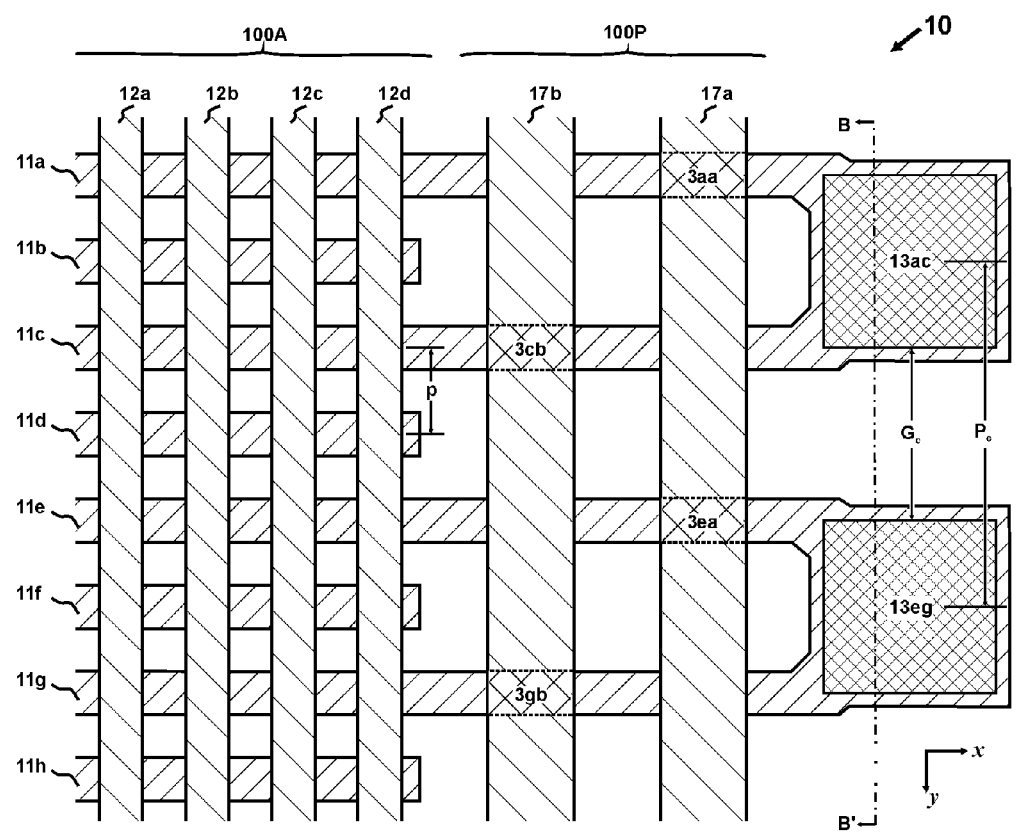
FIG. 2D is a top view of the memory level 10.

Referring now to FIGS. 2A-2E, a first preferred compact three-dimensional memory (3D-M$_C$), including an intra-level decoder stage, is disclosed. It comprises two memory levels 10, 20 stacked above a substrate 0 (FIG. 2C). The memory level 10 comprises a memory array 100A and an intra-level decoder stage 100P (referring to FIG. 2A for a circuit schematic and FIG. 2D for a top view). The memory array 100A comprises a plurality of x-lines 11a-11h . . . , y-lines 12a-12d . . . , and memory devices 1aa-1ad . . . (FIG. 2A). The intra-level decoder stage 100P selects one signal from two address-select lines in the same memory level. It comprises two control lines 17a, 17b and a plurality of simple switching devices (e.g., pass transistors) 3aa, 3cb, 3ea, 3gb . . . . Each switching device (e.g. 3aa) is formed at the intersection of a control line 17a and an x-line 11a and positioned between memory devices 1aa-1ad and the contact via 13ac (FIG. 2D). The switching device 3aa is generally a three-terminal device, e.g. a pass transistor. Examples include MOSFET (metal-oxide-semiconductor FET) and JFET (junction FET). It has a conduction mode and a blocking mode. In the conduction mode, the switching device 3aa is turned on and configured to allow current flow in the x-line 11a. In the blocking mode, the switching device 3aa is turned off and configured to block current flow in the x-line 11a.

Aided by the intra-level decoder stage 100P, the x-lines in the memory level 10 are grouped into pairs and each pair shares a same contact via, i.e., they are both coupled to the same contact via (FIGS. 2A & 2D). For example, a first x-line pair formed by the x-lines 11a, 11c share a first contact via 13ac, while a second x-line pair formed by the x-lines 11e, 11g share a second contact via 13eg. The contact via 13ac is selectively coupled to either the x-line 11a or the x-line 11c based on the voltage on the control lines 17a, 17b. When the voltage on the control line 17a turns on the switching device 3aa while the voltage on the control line 17b turns off the switching device 3cb, the contact via 13ac is coupled to the x-line 11a. On the other hand, when the voltage on the control line 17a turns off the switching device 3aa while the voltage on the control line 17b turns on the switching device 3cb, the contact via 13ac is coupled to the x-line 11c. Sharing effectively doubles the size $D_c$ and spacing $G_c$ of the contact vias (i.e., $D_c=4f=2p$, $G_c=4F=2p$) (FIG. 2D), and lowers their manufacturing cost.

Out of two intersections between the x-line 11a and two control lines 17a, 17b, only one switching device 3aa is formed at the intersection of 17a and 11a. For the device 3ab formed at the intersection of 17b and 11a, although it looks like a memory device (FIG. 2C), the voltage on the control line 17b generally reverse-biases this device and therefore, it performs neither switching function nor memory function (FIG. 2A). At this intersection 3ab, the control line 17b and the x-line 11a are simply isolated from each other.

Figure 1C:
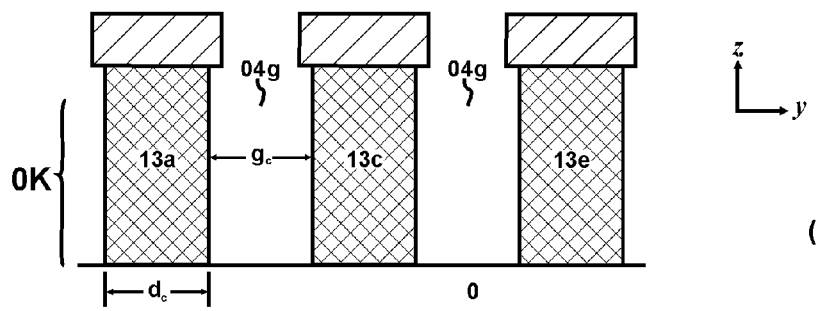
FIG. 1C is a cross-sectional view of FIG. 1B along the cut-line AA'.
Figure 1D:
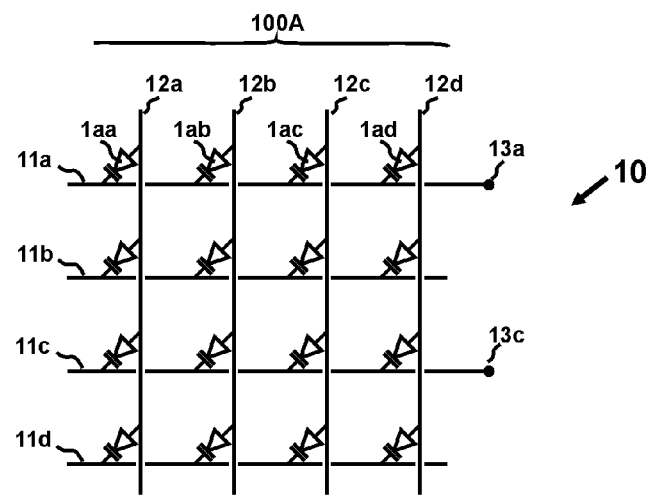
FIG. 1D is a circuit schematic for the memory level 10.
Figure 1E:
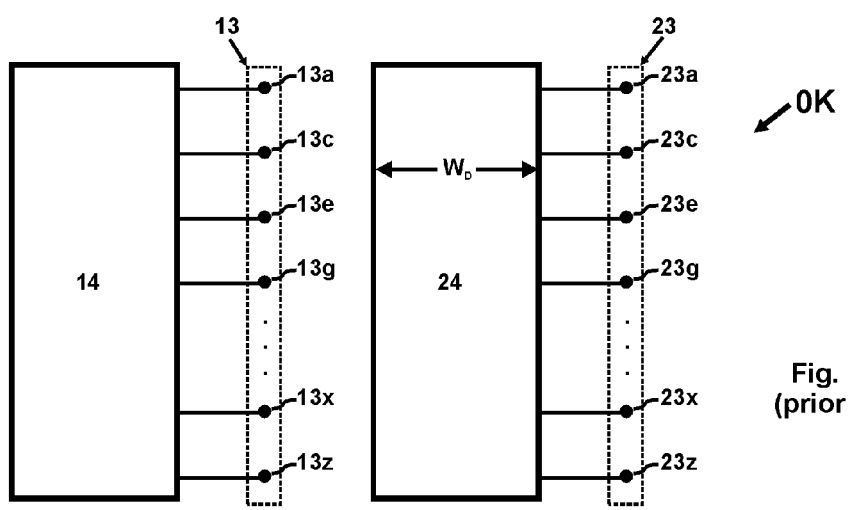
FIG. 1E is a block diagram of the substrate circuit 0K including decoders 14, 24 for memory levels 10, 20.

The substrate circuit 0K comprises a common decoder 06 for the memory levels 10, 20 (FIG. 2B). It is coupled with the contact vias 13ac, 13eg of the memory level 10 and the contact vias 23ac, 23eg of the memory level 20. Note that the interconnect 06i that couples the contact via 23ac (or 23eg) of the memory level 20 to the common decoder 06 has to pass through the gap 06G between the contact vias 13ac, 13eg of the memory level 10 (FIGS. 2B & 2E). In prior arts, because the gap $g_c$ (=1p) between the contact vias 13a, 13c is too small, the common decoder 06 cannot be realized and each memory levels (e.g., 10) has to use its own decoder (e.g., 14) (FIGS. 1C & 1E). With a large contact-via spacing $G_c$ (=2p), the interconnect 06i coupling the contact via 23ac of the memory level 20 with the common decoder 06 can pass through the gap 06G between the contact vias 13ac, 13eg of the memory level 10 (FIG. 2E). Thus, a substantial portion of the decoder 24 for the memory level 20 can be moved to the other side of the contact-via set 13 and shared with the decoder 14 for the memory level 10. Compared with that of FIG. 1A, the x-peripheral length $L_{px}$ is considerably shorter (FIG. 2C). Consequently, the memory block 100 has a higher array efficiency.

Figure 3A:
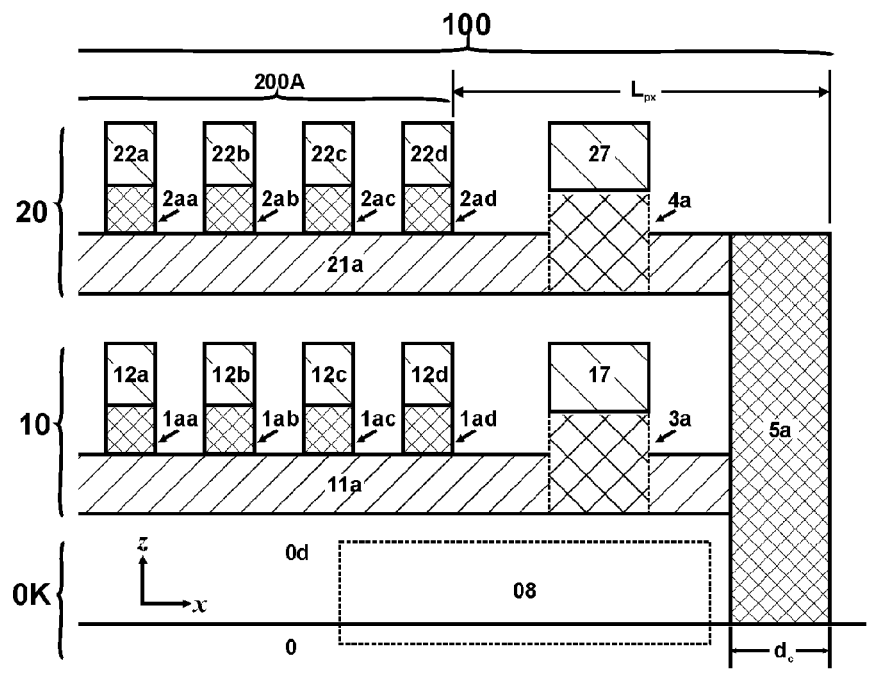
FIG. 3A is a cross-sectional view of a second preferred 3D-$M_C$, including an inter-level decoder stage.
Figure 3B:
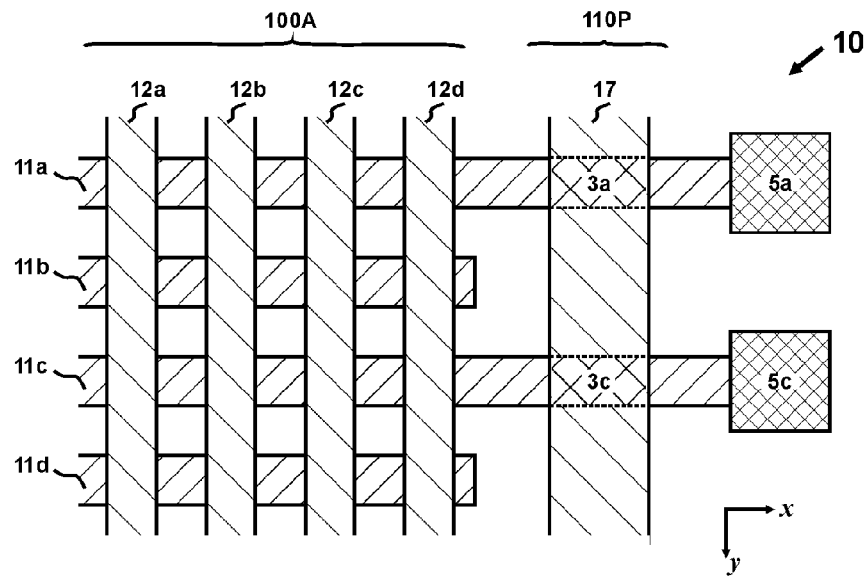
FIG. 3B is a top view of the memory level 10.
Figure 3C:
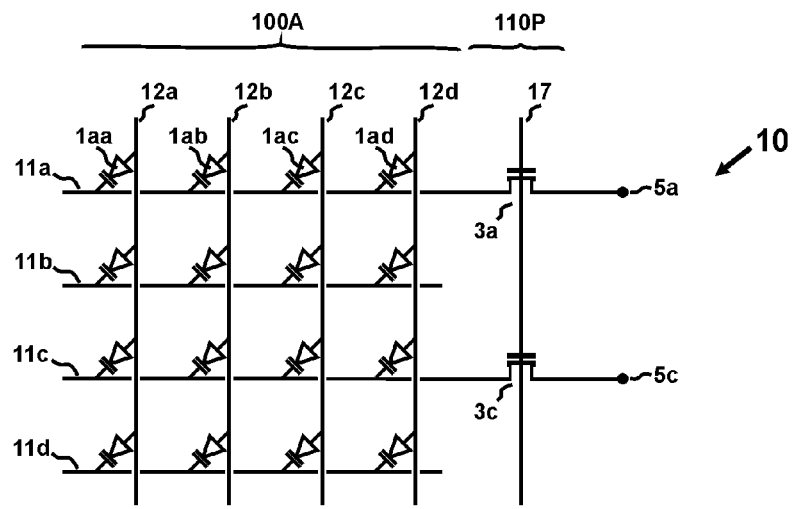
FIG. 3C is a circuit schematic for the memory level 10.

Referring now to FIGS. 3A-3D, a second preferred 3D-M$_C$, including an inter-level decoder stage, is disclosed. It comprises two memory levels 10, 20 stacked above a substrate 0 (FIG. 3A). The memory level 10 comprises a memory array 100A and a first portion 110P of the inter-level decoder stage (FIGS. 3B & 3C). The memory array 100A comprises a plurality of x-lines 11a-11d . . . , y-lines 12a-12d . . . , and memory devices 1aa-1ad . . . . The inter-level decoder stage selects one signal from two address-select lines in two different memory levels. Its first portion 110P comprises a control line 17 and a plurality of simple switching devices 3a, 3c . . . . The switching device 3a is formed at the intersection of the control line 17 and the x-line 11a and positioned between memory devices 1aa-1ad and the contact via 5a (FIG. 3A). The switching device 3a is generally a three-terminal device, e.g. a pass three-transistor. Examples include MOSFET (metal-oxide-semiconductor FET) and JFET (junction FET). It has a conduction mode and a blocking mode, which is controlled by the voltage on the control line 17.

Figure 3D:
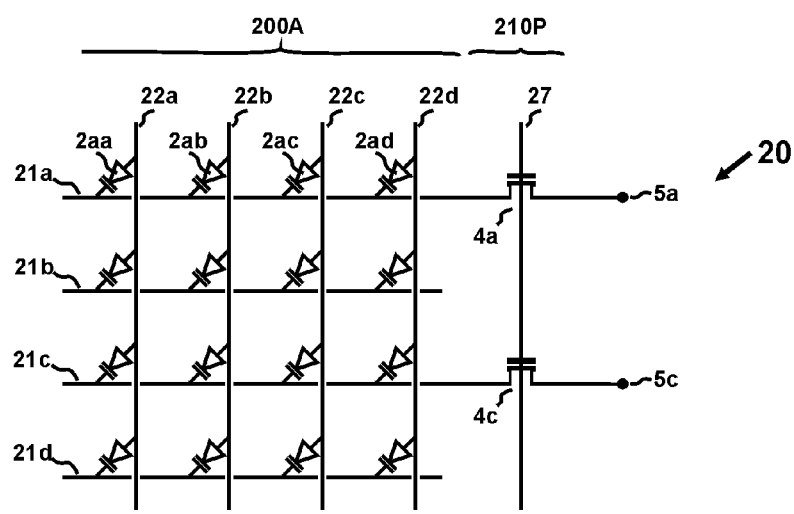
FIG. 3D is a circuit schematic for the memory level 20.

The memory level 20 comprises a memory array 200A and a second portion 210P of the inter-level decoder stage (FIG. 3D). This second portion 210P comprises a control line 27 and a plurality of simple switching devices 4a, 4c . . . . The switching device 4a is formed at the intersection of the control line 27 and the x-line 21a and positioned between memory devices 2aa-2ad and the contact via 5a. The switching device 4a is generally a three-terminal device, e.g. a pass transistor. Examples include MOSFET (metal-oxide-semiconductor FET) and JFET (junction FET). It has a conduction mode and a blocking mode, which is controlled by the voltage on the control line 27.

Aided by the inter-level decoder stage, the memory levels 10, 20 can share a same contact-via set. To be more specific, the x-lines from different memory levels 10, 20 are grouped into pairs and each pair share a same contact via, i.e. they are both coupled to the same contact via (FIG. 3A). For example, the x-lines 11a, 21a form a first x-line pair and share a first contact via 5a, while the x-lines 11c, 21c form a second x-line pair and share a second contact via 5c (FIGS. 3C & 3D). The contact via 5a is selectively coupled to either the x-line 11a or the x-line 21a based on the voltage on the control lines 17, 27. When the voltage on the control line 17 turns on the switching device 3a and the voltage on the control line 27 turns off the switching device 4a, the contact via 5a is coupled to the x-line 11a of the memory level 10. On the other hand, when the voltage on the control line 17 turns off the switching device 3a and the voltage on the control line 27 turns on the switching device 4a, the contact via 5a is coupled to the x-line 21a of the memory level 20. The memory levels 10, 20 share a common decoder 08 in the substrate circuit 0K. Because the x-peripheral length $L_{px}$ of FIG. 3A is considerably shorter than that of FIG. 1A, the memory block 100 has a higher array efficiency.

Sharing the contact vias among memory levels can greatly simplify the manufacturing process of the 3D-$M_C$. In prior arts (FIG. 1A), as each memory level has separate contact vias, a large number of contact-via sets need to be manufactured. In this preferred embodiment (FIG. 3A), all memory levels (e.g. 8 memory levels) share a single contact-via set. This contact-via set can be formed at once after all memory levels (e.g. 10, 20) and has a lower manufacturing cost. To be more specific, after the formation of all memory levels (e.g. 10, 20), a contact hole is etched abutting the end of the x-lines (e.g. 11a, 21a). By filling this contact hole with conductive materials, simultaneous contact with x-lines in all memory levels can be realized.

Figure 4A:
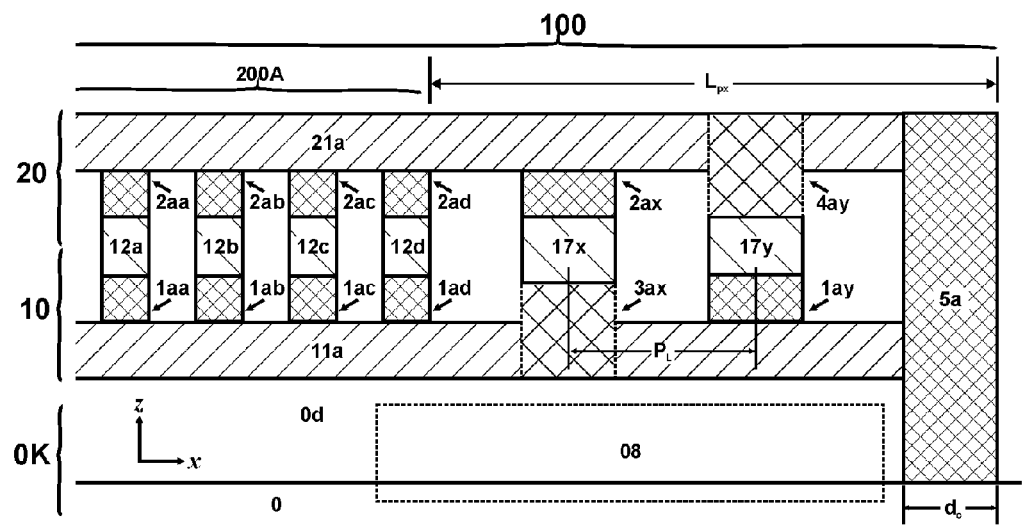
FIG. 4A is cross-sectional view of a third preferred 3D-M$_C$, including a shared decoder stage.
Figure 4B:
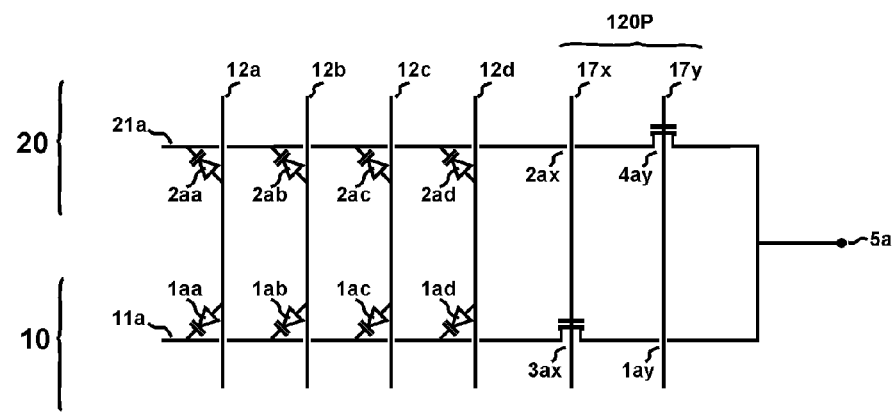
FIG. 4B is a circuit schematic for the memory levels 10, 20.

Referring now to FIGS. 4A-4B, a third preferred 3D-$M_C$, including a shared decoder stage, is disclosed. It comprises two interleaved memory levels 10, 20 stacked above a substrate 0 (FIG. 4A), i.e. they share the address-select lines (y-lines) 12a-12d . . . . The memory level 10 comprises a first plurality of memory devices 1aa-1ad . . . and the memory level 20 comprises a second plurality of memory devices 2aa-2ad . . . (FIG. 4B). A shared decoder stage 120P is formed between the memory levels 10 and 20 and functions as both intra-level and inter-level decoder stages. It comprises two control lines 17x, 17y and a plurality of switching devices 3ax, 4ay . . . . The switching device 3ax is formed at the intersection of the control line 17x and the x-line 11a. It is positioned between memory devices 1aa-1ad and the contact via 5a. On the other hand, the switching device 4ay is formed at the intersection of the control line 17y and the x-line 21a. It is positioned between memory devices 2aa-2ad and the contact via 5a. Similarly, these switching devices 3ax, 4ay are generally three-terminal devices, e.g. pass transistors. Examples include MOSFET (metal-oxide-semiconductor FET) and JFET (junction FET). The contact via 5a is selectively coupled to either the x-line 11a of the memory level 10 or the x-line 21a of the memory level 20 based on the voltage on the control lines 17x, 17y.

Combining the techniques of FIGS. 2A-4B, a 3D-$M_C$ with an extremely high array efficiency can be designed. Take a 3D-$M_C$ with 8 interleaved memory levels (comprising 5 x-line levels and 4 y-line levels) as an example. Along the +x-direction, it has 7 control lines, including 2 control lines for an intra-level decoder stage and 5 control lines for an inter-level decoder stage controlling 5 x-line levels. Each contact via is shared by a total of 10 x-lines, including 2 x-lines in each of 5 x-line levels. Thus, the x-peripheral length $L_{px}=7P_L+P_c=18p$, where $P_L$ is the pitch of control lines ($P_L=2p$, as in FIG. 4A) and $P_c$ is the pitch of contact via ($P_c=4p$, as in FIG. 2D). Assuming the array size is 1000*1000 memory devices (i.e. N=1000), the x-efficiency $E_x=(1+2*18p/1000p)^{-1} \approx 96.4\%$. Along the +y-direction, it has 2 control lines for an intra-level decoder stage. The y-peripheral length $L_{py}=2P_L+P_c=8p$ and the y-efficiency $E_y=(1+2*8p/1000/p)^{-1} \approx 98.4\%$. Overall, the array efficiency $E_A=E_x*E_y \approx 95\%$.

In a 3D-$M_C$, the switching device could be a MOSFET (FIGS. 5-10C) or JFET (FIG. 11A-13B). To form simple switching devices (e.g., pass transistors), the address-selection line needs to be re-engineered. In the preferred embodiments of FIGS. 5-6B and FIGS. 11A-11B, the address-selection line comprises a heavily doped semiconductor material, while the address-selection line-segment within the switch device is counter doped in such a way that it becomes semi-conductive. In the preferred embodiments of FIGS. 7-8D and FIGS. 12A-12B, the address-selection line comprises a lower semi-conductive layer and an upper highly-conductive layer. Within the switching device, the upper highly-conductive layer of the address-selection line is removed and only the lower semi-conductive layer remains. In the preferred embodiments of FIGS. 9-10C and FIGS. 13A-13B, the address-selection line comprises a metallic material while the portion of the address-selection line within the switching device is removed and filled with a semi-conductive material.

Figure 5:
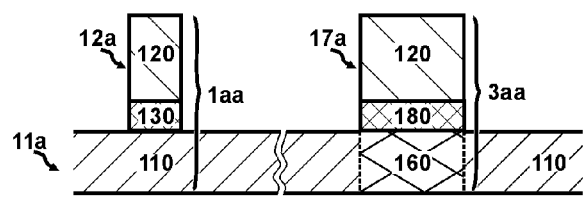
FIG. 5 is a cross-sectional view of a first preferred MOSFET-type switching device 3aa along with a memory device 1aa.

Referring now to FIG. 5, a first preferred MOSFET-type switching device 3aa along with a memory device 1aa is disclosed. The memory device 1aa comprises a top electrode 120, a memory layer 130 and a bottom electrode 110. The top electrode 120 is part of the y-line 12a. The memory layer 130 could comprise a programmable layer and a diode layer. The state of the programmable layer can be altered during or after manufacturing; the diode layer generally has the following I-V characteristic: its resistance at the read voltage is substantially lower than when the applied voltage has a magnitude smaller than or polarity opposite to that of the read voltage. The bottom electrode 110 is part of the x-line 11*a*. It comprises a heavily doped semiconductor material and is highly conductive.

The simple switching device 3*aa* comprises a top electrode 120, a middle layer 180 and a modulating layer 160. The top electrode 120 comprises the same material as the top electrode 120 of the memory device 1*aa*. It is part of the control line 17*a*. The middle layer 180 could comprise the same material as the memory layer 130 of the memory device 1*aa*. It insulates the top electrode 120 from the modulating layer 160 because the voltage on the control line 17*a* generally reverse-biases the middle layer 180. The modulating layer 160, although it is part of the x-line 11*a*, is counter doped in such a way that it becomes semi-conductive. For example, the bottom electrode 110 of the memory device 1*aa* is heavily n-type doped; and, the modulating layer 160 of the switching device 3*aa* is counter doped to lightly n-type. As a result, the switching-device 3*aa* is a depletion-mode MOSFET. If a large enough negative voltage is applied to the control line 17*a*, the modulating layer 160 will become so depleted that it blocks the current flow in the x-line 11*a*.

Figure 6A:
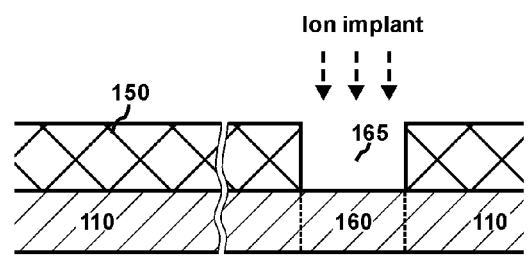
FIGS. 6A-6B illustrate two preferred methods to manufacture the first preferred MOSFET-type switching device.
Figure 6B:
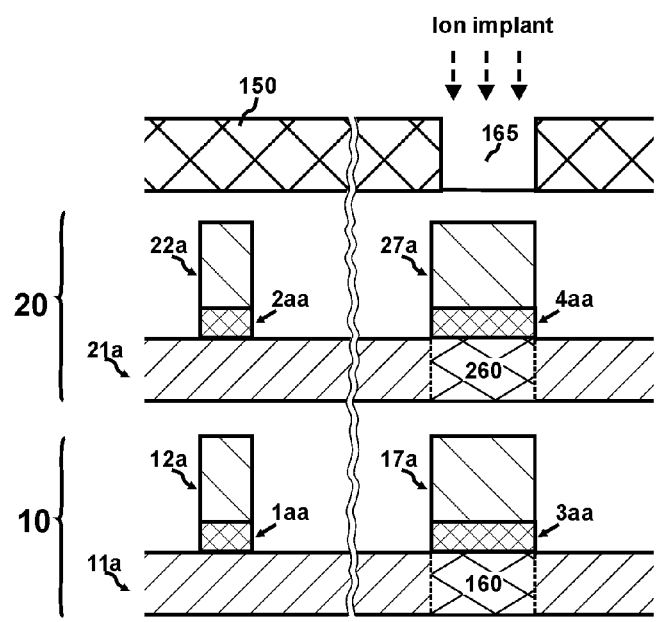

FIGS. 6A-6B illustrate two preferred methods to manufacture the first preferred MOSFET-type switching device 3*aa*. In the preferred method of FIG. 6A, after the formation of the bottom electrode 110, a photo-resist layer 150 with a pre-determined pattern is applied and counter doping is performed using ion implant through a hole 165 in the photo-resist layer 150. After removing the photo-resist layer 150, the memory layer 130 (including the middle layer 180) is formed on top of the bottom electrode 110. The memory layer 130 and the bottom electrode 110 are etched together to define the x-lines 11*a*. Afterwards, the top electrode 120 is formed to define the y-lines 12*a* and the control line 17*a*. In this preferred embodiment, a counter doping step is performed for each memory level. To lower the manufacturing cost, the counter doping step is performed after all memory levels 10, 20 have been formed in the preferred method of FIG. 6B.

Figure 7:
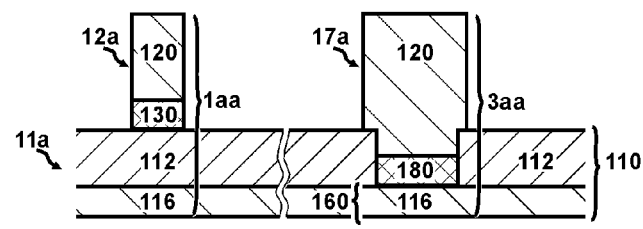
FIG. 7 is a cross-sectional view of a second preferred MOSFET-type switching device along with a memory device.

Referring now to FIG. 7, a second preferred MOSFET-type switching device 3*aa* along with a memory device 1*aa* is disclosed. Similar to FIG. 5, the memory device 1*aa* comprises a top electrode 120, a memory layer 130 and a bottom electrode 110, while the switching device 3*aa* comprises a top electrode 120, a middle layer 180 and a modulating layer 160. Different from FIG. 5, the bottom electrode 110 of the memory device 3*aa* comprises a lower semi-conductive layer 116 and an upper highly-conductive layer 112. However, the modulating layer 160 of the switching device 3*aa* comprises only the lower semi-conductive layer 116. As a result, the switching-device 3*aa* is a depletion-mode MOSFET. If a large enough negative voltage is applied to the control line 17*a*, the modulating layer 160 will become so depleted that it blocks the current flow in the x-line 11*a*.

Figure 8A:
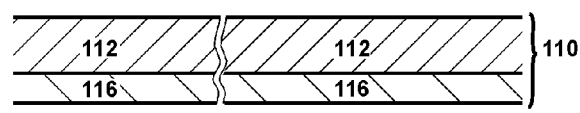
FIGS. 8A-8D illustrate four preferred steps to manufacture the second preferred MOSFET-type switching device.
Figure 8B:
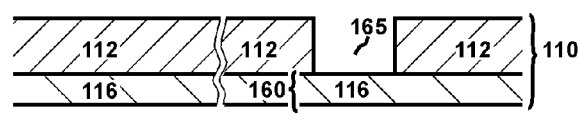
Figure 8C:
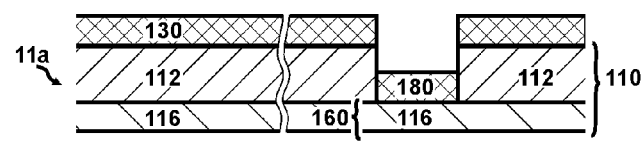
Figure 8D:
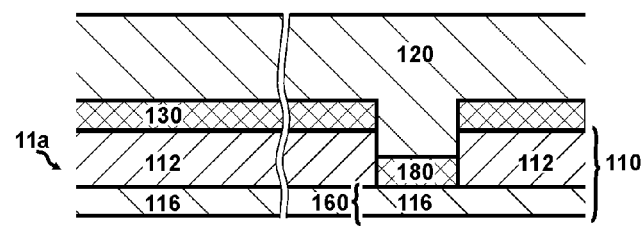

FIGS. 8A-8D illustrate four preferred steps to manufacture the second preferred MOSFET-type switching device. The lower semi-conductive layer 116 and the upper highly-conductive layer 112 are formed first (FIG. 8A). Then the upper highly-conductive layer 112 is removed at the location 165 of the switching device 3*aa* (FIG. 8B). This is followed by the formation of the memory layer 130 and definition of the x-line 11*a* (FIG. 8C). Finally, the top electrode 120 is formed to define the y-lines 12*a* and the control line 17*a* (FIG. 8D).

Figure 9:
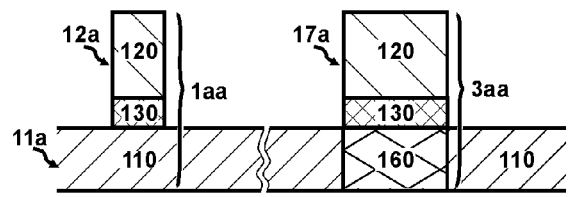
FIG. 9 is a cross-sectional view of a third preferred MOSFET-type switching device along with a memory device.

Referring now to FIG. 9, a third preferred MOSFET-type switching device 3*aa* along with a memory device 1*aa* is disclosed. Similar to FIG. 5, the memory device 1*aa* comprises a top electrode 120, a memory layer 130 and a bottom electrode 110, while the switching device 3*aa* comprises a top electrode 120, a middle layer 180 and a modulating layer 160. Different from FIG. 5, the bottom electrode 110 comprises a metallic material, while the modulating layer 160 of the switching device 3*aa* comprises a semi-conductive material. Overall, the switching-device 3*aa* is a depletion-mode MOSFET. If a large enough negative voltage is applied to the control line 17*a*, the modulating layer 160 will become so depleted that it blocks the current flow in the x-line 11*a*.

Figure 10A:
FIGS. 10A-10C illustrate three preferred steps to manufacture the third preferred MOSFET-type switching device.
Figure 10B:
Figure 10C:
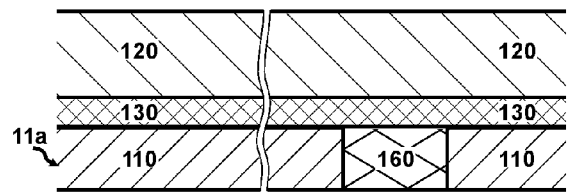

FIGS. 10A-10C illustrate three preferred steps to manufacture the third preferred MOSFET-type switching device. The bottom electrode 110 is formed first. It is completely removed at the location of the switching device 3*aa* to form a hole 165 (FIG. 10A). Then a semi-conductive material fills the hole 165 and is planarized (FIG. 10B). This is followed by the formation of the memory layer 130 and definition of the x-line 11*a*. Finally, the top electrode 120 is formed (FIG. 1OC) to define the y-lines 12*a* and the control line 17*a*.

Figure 11A:
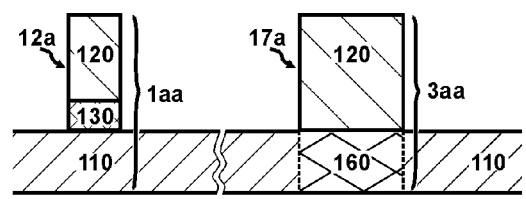
FIG. 11A is a cross-sectional view of a first preferred JFET-type switching device along with a memory device.
Figure 11B:
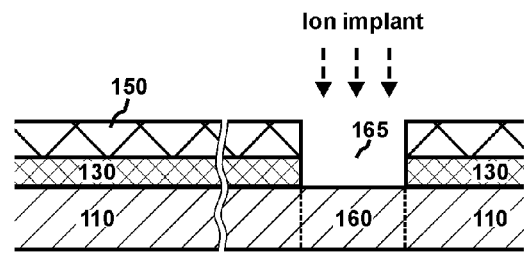
FIG. 11B illustrates a preferred step to manufacture the first preferred JFET-type switching device.

Referring now to FIGS. 11A-11B, a first preferred JFET-type switching device 3*aa* is disclosed. Compared with FIG. 5, the switching device 3*aa* does not comprise the middle layer 180 (FIG. 11A). As such, the top electrode 120 and the modulation layer 160 form a Schottky diode (or P-N diode) and the switching device 3*aa* is a JFET. Its manufacturing is similar to that of FIGS. 6A-6B. The only difference is that the bottom electrode 110 and the memory layer 130 are formed before the photo-resist 150 is applied. In addition, the memory layer 130 is removed in the hole 165 (FIG. 11B).

Figure 12A:
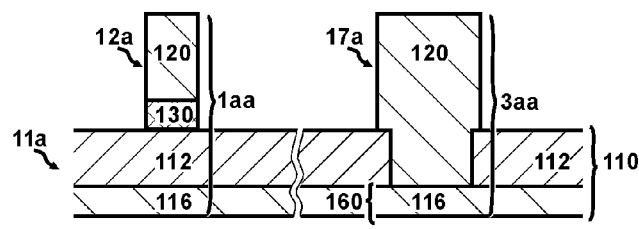
FIG. 12A is a cross-sectional view of a second preferred JFET-type switching device along with a memory device.
Figure 12B:
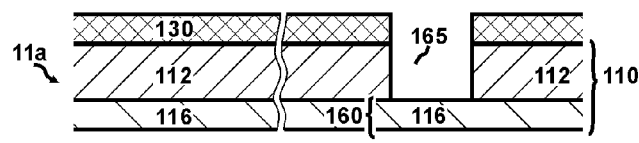
FIG. 12B illustrates a preferred step to manufacture the second preferred JFET-type switching device.

Referring now to FIGS. 12A-12B, a second preferred JFET-type switching device 3*aa* is disclosed. Compared with FIG. 7, the switching device 3*aa* does not comprise the middle layer 180 (FIG. 12A). As such, the top electrode 120 and the modulation layer 160 form a Schottky diode (or P-N diode) and the switching device 3*aa* is a JFET. Its manufacturing is similar to that of FIGS. 8A-8D. The only difference is that the memory layer 130 is formed with the bottom electrode 110. In addition, the memory layer 130 and the upper highly-conductive layer 112 are removed together at the location 165 (FIG. 12B).

Figure 13A:
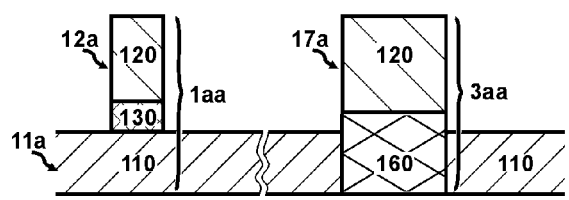
FIG. 13A is a cross-sectional view of a third preferred JFET-type switching device along with a memory device.
Figure 13B:
FIG. 13B illustrates a preferred step to manufacture the third preferred JFET-type switching device.

Referring now to FIGS. 13A-13B, a third preferred JFET-type switching device 3*aa* is disclosed. Compared with FIG. 9, the switching device 3*aa* does not comprise the middle layer 180 (FIG. 13A). As such, the top electrode 120 and the modulation layer 160 form a Schottky diode (or P-N diode) and the switching device 3*aa* is a JFET. Its manufacturing is similar to that of FIGS. 10A-10C. The only difference is that the memory layer 130 is formed with the bottom electrode 110. In addition, they are removed together at the location 165 and the modulation layer 160 is planarized with the memory layer 130 (FIG. 13B).

Figure 14A:
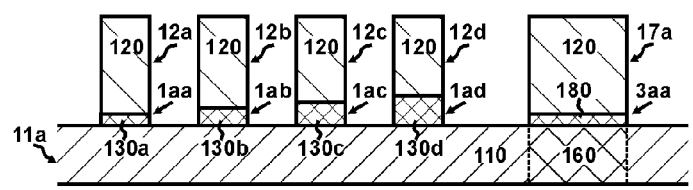
FIGS. 14A-14C are cross-sectional views of three preferred MOSFET-type switching devices along with four 3D-MPROM devices.
Figure 14B:
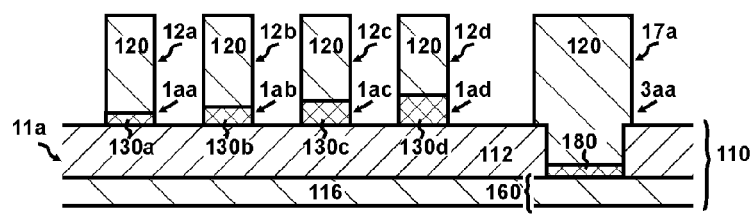
Figure 14C:
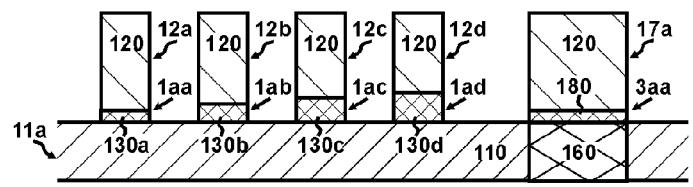

Referring now to FIGS. 14A-14C, three preferred MOSFET-type switching devices 3*aa* along with four 3D-MPROM devices 12*a*-12*d* are disclosed. The switching device 3*aa* in FIG. 14A is similar to that in FIG. 5; the switching device 3*aa* in FIG. 14B is similar to that in FIG. 7; and the switching device 3*aa* in FIG. 14C is similar to that in FIG. 9. Different from 3D-EPROM, the 3D-MPROM devices 12*a*-12*d* representing different digital data have different memory layers. For example, in a 2-bit-per-cell 3D-MPROM, the memory device 12*a* representing digital "00" has the thinnest memory layer 130*a*; the memory device 12*b* representing digital "01" has the second thinnest memory layer 130*b*; the memory device 12*c* representing digital "10" has the third thinnest memory layer 130*c*; and the memory device 12d representing digital "11" has the thickest memory layer 130d. In order to effectively block the current flow in the x-line 11a, the middle layer 180 in the switching device 3aa preferably uses the thinnest memory layer 130a (FIGS. 14A-14C).

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A compact three-dimensional memory (3D-$M_C$) comprising at least a first memory level stacked above a semiconductor substrate with transistors thereon, said first memory level comprising:
    a continuous and conductive first x-line;
    a contact via coupling said first x-line with said semiconductor substrate;
    a continuous and conductive y-line intersecting said first x-line at a first intersection, at least the portion of said first x-line at said first intersection comprising a heavily doped semiconductor material, wherein a first memory device is formed at said first intersection;
    a continuous and conductive first control line intersecting said first x-line at a second intersection, the portion of said first x-line at said second intersection comprising a lightly doped semiconductor material, wherein a first switching device is formed at said second intersection, said first switching device is located between said first memory device and said contact via;
    wherein said first switching device is configured to block current conduction in said first x-line in a first mode and allow current conduction in said first x-line in a second mode.

2. The memory according to claim 1, wherein said first memory device is a two-terminal device.

3. The memory according to claim 1, wherein said 3D-M comprises a three-dimensional read-only memory (3D-ROM).

4. The memory according to claim 1, wherein said 3D-M comprises a three-dimensional random-access memory (3D-RAM).

5. The memory according to claim 1, wherein said first switching device is a three-terminal device.

6. The memory according to claim 5, wherein said first switching device is a transistor.

7. The memory according to claim 6, wherein said first switching device is a MOSFET, or a JFET.

8. A compact three-dimensional memory (3D-$M_C$) comprising at least a first memory level stacked above a semiconductor substrate with transistors thereon, said first memory level comprising:
    a continuous and conductive first x-line;
    a contact via coupling said first x-line with said semiconductor substrate;
    a continuous and conductive y-line intersecting said first x-line at a first intersection, at least the portion of said first x-line at said first intersection comprising an upper highly conductive layer and a lower lightly doped semiconductor layer, wherein a first memory device is formed at said first intersection;
    a continuous and conductive first control line intersecting said first x-line at a second intersection, the portion of said first x-line at said second intersection comprising said lightly doped semiconductor layer but not said highly conductive layer, wherein a first switching device is formed at said second intersection, said first switching device is located between said first memory device and said contact via;
    wherein said first switching device is configured to block current conduction in said first x-line in a first mode and allow current conduction in said first x-line in a second mode.

9. The memory according to claim 8, wherein said first memory device is a two-terminal device.

10. The memory according to claim 8, wherein said 3D-M comprises a three-dimensional read-only memory (3D-ROM).

11. The memory according to claim 8, wherein said 3D-M comprises a three-dimensional random-access memory (3D-RAM).

12. The memory according to claim 8, wherein said first switching device is a three-terminal device.

13. The memory according to claim 12, wherein said first switching device is a transistor.

14. The memory according to claim 12, wherein said first switching device is a MOSFET, or a JFET.

15. A compact three-dimensional memory (3D-$M_C$) comprising at least a first memory level stacked above a semiconductor substrate with transistors thereon, said first memory level comprising:
    a continuous and conductive first x-line;
    a contact via coupling said first x-line with said semiconductor substrate;
    a continuous and conductive y-line intersecting said first x-line at a first intersection, at least the portion of said first x-line at said first intersection comprising a metallic material, wherein a first memory device is formed at said first intersection;
    a continuous and conductive first control line intersecting said first x-line at a second intersection, the portion of said first x-line at said second intersection comprising a lightly doped semiconductor material, wherein a first switching device is formed at said second intersection, said first switching device is located between said first memory device and said contact via;
    wherein said first switching device is configured to block current conduction in said first x-line in a first mode and allow current conduction in said first x-line in a second mode.

16. The memory according to claim 15, wherein said first memory device is a two-terminal device.

17. The memory according to claim 15, wherein said 3D-M comprises a three-dimensional read-only memory (3D-ROM).

18. The memory according to claim 15, wherein said 3D-M comprises a three-dimensional random-access memory (3D-RAM).

19. The memory according to claim 15, wherein said first switching device is a three-terminal device.

20. The memory according to claim 19, wherein said first switching device is a transistor.

* * * * *